(12) United States Patent
Tung et al.

(10) Patent No.: US 11,818,880 B2
(45) Date of Patent: Nov. 14, 2023

(54) SEMICONDUCTOR STRUCTURE INCLUDING CAPACITOR AND METHOD FOR FORMING THE SAME

(71) Applicant: Fujian Jinhua Integrated Circuit Co., Ltd., Quanzhou (CN)

(72) Inventors: Yu-Cheng Tung, Quanzhou (CN); Janbo Zhang, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 17/742,376

(22) Filed: May 11, 2022

(65) Prior Publication Data
US 2023/0320073 A1    Oct. 5, 2023

(30) Foreign Application Priority Data
Mar. 29, 2022   (CN) ........................ 202210323738.6
Mar. 29, 2022   (CN) ........................ 202220717300.1

(51) Int. Cl.
    *H10B 12/00*      (2023.01)

(52) U.S. Cl.
    CPC ......... *H10B 12/315* (2023.02); *H10B 12/033* (2023.02)

(58) Field of Classification Search
    CPC ........................... H10B 12/033; H10B 12/315
    See application file for complete search history.

(56) References Cited

U.S. PATENT DOCUMENTS

2018/0166320 A1*   6/2018   Kim .................... H01L 21/7687

\* cited by examiner

*Primary Examiner* — Robert G Bachner
*Assistant Examiner* — Molly K Reida
(74) *Attorney, Agent, or Firm* — Winston Hsu

(57) ABSTRACT

A semiconductor structure includes a substrate having first and second bottom electrodes disposed thereon. The first bottom electrode includes a first sidewall and a second sidewall. An upper portion of the first sidewall comprises a slope profile. The second bottom electrode includes a third sidewall and a fourth sidewall. The second sidewall is opposite to the third sidewall. An upper supporting layer extends laterally between and the first bottom electrode and the second bottom electrode and directly contacts the second sidewall and the third sidewall. A lower end of the slope profile is not lower than a lower surface of the upper supporting layer. A cavity extends laterally between the substrate and the upper supporting layer. A capacitor dielectric layer is formed along the first bottom electrode and the second bottom electrode. A conductive material is formed on the capacitor dielectric layer and fills the cavity.

20 Claims, 10 Drawing Sheets

SEMICONDUCTOR STRUCTURE INCLUDING CAPACITOR AND METHOD FOR FORMING THE SAME

BACKGROUND OF THE INVENTION

1. Field of the Invention

The present invention relates to a semiconductor structure and a method for forming the same. More particularly, the present invention relates to a semiconductor structure including stacked capacitors and a method for forming the same.

2. Description of the Prior Art

A dynamic random access memory (DRAM) device is a kind of volatile memory. A DRAM device usually includes a memory region including an array of memory cells and a peripheral region including control circuits. Typically, a memory cell is composed of one transistor and one capacitor electrically coupled to the transistor, which is also known as a 1T1C cell. A digital data is stored in a memory cell by controlling the transistor to charge or discharge the capacitor. The control circuits in the peripheral region may address each of the memory cells in the array region to read, write or erase data by columns of word lines and rows of bit lines that respectively traverse through the array region and are electrically connected to each of the memory cells.

In advanced technology, three-dimensional (3D) structure including buried word lines and stacked capacitors has been widely used to shrink the memory cells to form DRAM devices having higher array density. Stacked capacitors are vertically disposed on the substrate of and have electrodes extending upward, such that the capacitors would not occupy substrate areas, and the capacitances of the capacitors may be increased by simply increase the height of the electrodes. However, as the memory cells are arranged in higher density, the spaces between stacked capacitors are shrunk, causing difficulty for manufacturing impact on device quality and stability.

SUMMARY OF THE INVENTION

One objective of the present invention is to provide a semiconductor structure and a method for forming the same, wherein the stacked capacitors of the semiconductor structure may provide improved quality and device uniformity.

One embodiment of the present invention provides a semiconductor structure including a substrate, and a first bottom electrode and a second bottom electrode disposed on the substrate. The first bottom electrode comprises a first sidewall and a second sidewall. The second bottom electrode comprises a third sidewall and a fourth sidewall, wherein the second sidewall and the third sidewall are opposite to each other, and an upper portion of the first sidewall comprises a slope profile. An upper supporting layer extends laterally between the first bottom electrode and the second bottom electrode and directly contacts the second sidewall and the third sidewall. The upper supporting layer comprises an upper surface and a lower surface, and a lower end of the slope profile of the first sidewall is not lower than the lower surface of the upper supporting layer. A cavity extends laterally between the substrate and the upper supporting layer. A capacitor dielectric layer covers along the first bottom electrode and the second bottom electrode. A conductive material is disposed on the capacitor dielectric layer and filling the cavity.

Another embodiment of the present invention provides a method for forming a semiconductor structure including the steps of providing a substrate having an upper sacrificial layer, an upper supporting layer and a hard mask layer disposed thereon, forming a plurality of bottom electrodes penetrating through the upper sacrificial layer, the upper supporting layer and the hard mask layer, forming at least an opening between the bottom electrodes and penetrating through the hard mask layer and the upper supporting layer to expose a portion of the upper sacrificial layer, wherein a portion of at least one of the bottom electrodes exposed from the opening has a slope profile, and a lower end of the slope profile is not lower than a lower surface of the upper supporting layer, removing the upper sacrificial layer from the opening to form a cavity between the upper sacrificial layer and the substrate, and forming a capacitor dielectric layer along the bottom electrodes and a conductive material filling the cavity.

One feature of the present invention is that the top portions of the bottom electrodes adjacent to the openings respectively have a slope profile, which may facilitate the capacitor dielectric layer and the conductive material being formed in the cavity with an improved film quality, so that reliability of the capacitors may be improved. Furthermore, by controlling the lower end of the slope profile not lower than the lower surface of the upper supporting layer, the differences between bottom electrodes with slope profiles (the bottom electrodes adjacent to the openings) and bottom electrodes without slope profiles (the bottom electrodes not adjacent to the openings) may be reduced, so that electrical characters of the capacitors may be more consistent.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

FIG. 1 and FIG. 3 are plan views. FIG. 2, FIG. 4, FIG. 5 and FIG. 6 are cross-sectional views taken along the line AA' as shown in FIG. 1 and FIG. 3.

FIG. 8 and FIG. 9 are schematic drawings illustrating a semiconductor structure according to still another embodiment of the present invention, wherein FIG. 8 is a plan view, and FIG. 9 is a cross-sectional view taken along the line AA' shown in FIG. 8.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. Other embodiments may be utilized and that structural, logical and electrical changes may be made without departing from the spirit and scope of the present invention.

Figure 1:
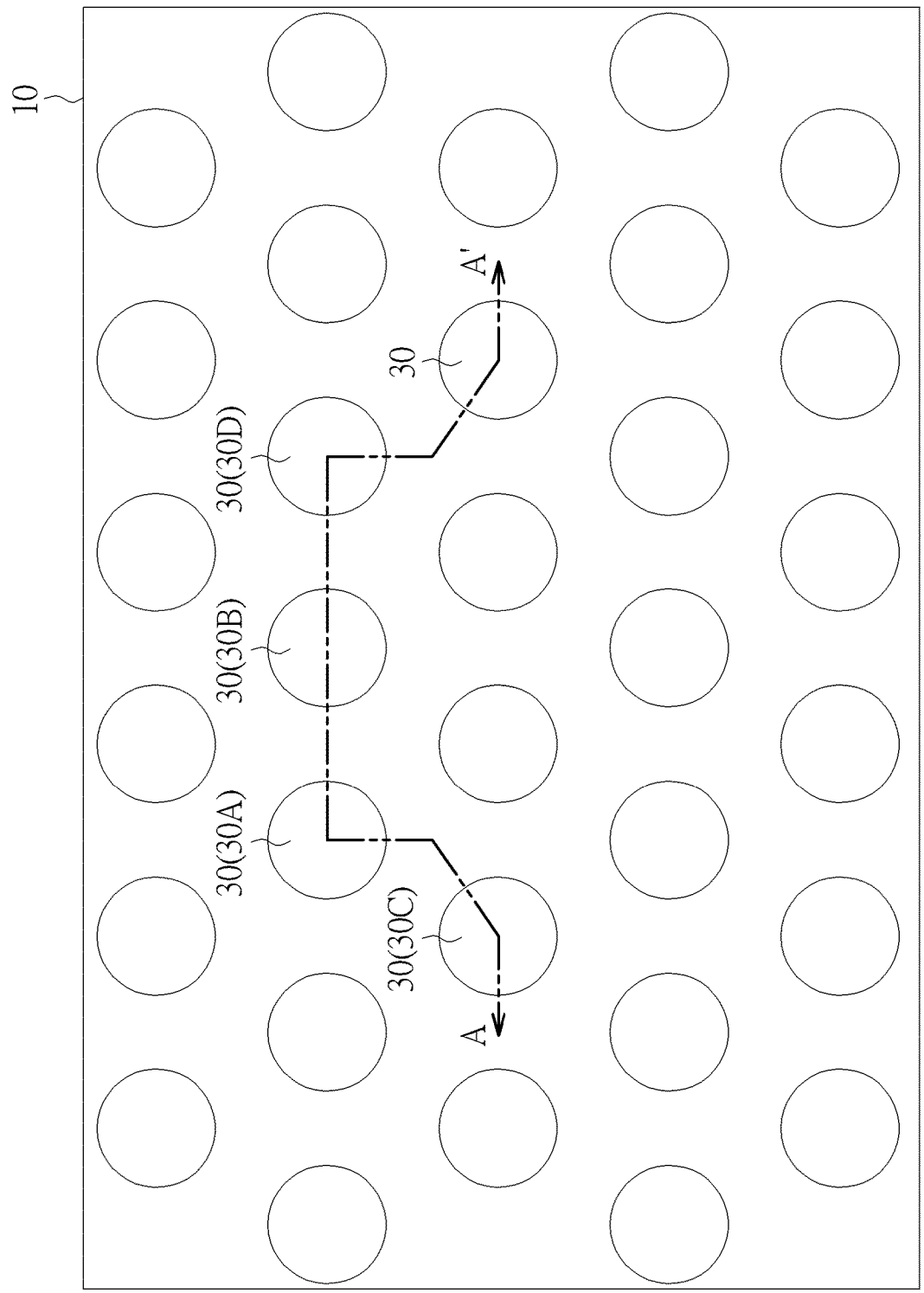
FIG. 1 to FIG. 6 are schematic drawings illustrating the steps for forming a semiconductor structure according to an embodiment of the present invention.
Figure 2:
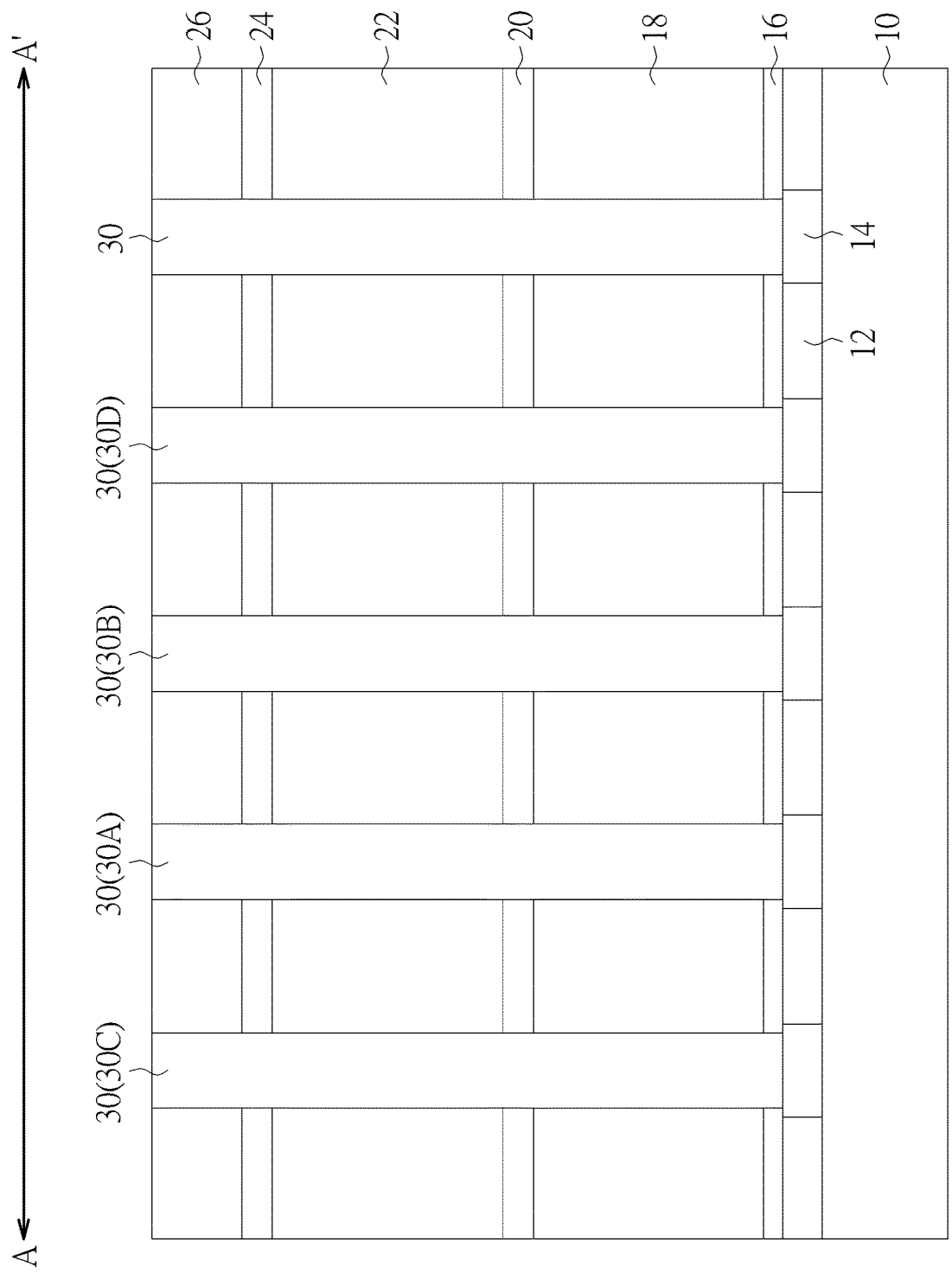

FIG. 1 to FIG. 6 are schematic drawings illustrating the steps for forming a semiconductor structure according to an embodiment of the present invention. Please refer to FIG. 1 and FIG. 2, a substrate 10 is provided. An interlayer dielectric layer 12 and a plurality of storage node contact pads 14 are formed on the substrate 10. Subsequently, a stacked structure is formed on the interlayer dielectric layer 12. As shown in FIG. 2, the stacked structure may include (from the bottom to the top) an etching stop layer 16, a lower sacrificial layer 18, a lower supporting layer 20, an upper sacrificial layer 22, an upper supporting layer 24, and a hard mask layer 26. Subsequently, a plurality of bottom electrodes 30 are formed on the substrate 10, penetrating through the stacked structure to directly contact the storage node contact pads 14, respectively.

The substrate 10 may be a silicon substrate, an epitaxial silicon substrate, a silicon germanium (SiGe) substrate, a silicon carbide (SiC) substrate, or a silicon-on-insulator (SOI) substrate, but is not limited thereto. Semiconductor devices and circuit structures such as transistors, buried word lines, bit lines, conductive plugs may be formed in the substrate 10 and are not shown in the drawings. The interlayer dielectric layer 12 is essentially made of a dielectric material, such as silicon oxide ($SiO_2$), silicon nitride (SiN), silicon oxynitride (SiON), silicon carbon nitride (SiCN), high-k dielectric material, or a combination thereof, but is not limited thereto. According to an embodiment of the present invention, the interlayer dielectric layer 12 is essentially made of silicon nitride (SiN). The storage node contact pads 14 are essentially made of a conductive material. Suitable conductive materials may include metals, such as tungsten (W), copper (Cu), aluminum (Al), titanium (Ti), tantalum (Ta), a compound, alloy or composite layer of the above metal materials, but is not limited thereto. According to an embodiment of the present invention, the storage node contact pads 14 are essentially made of tungsten (W). The etching stop layer 16, the lower sacrificial layer 18, the lower supporting layer 20, the upper sacrificial layer 22, the upper supporting layer 24, and the hard mask layer 26 of the stacked structure are essentially made of dielectric materials, wherein the lower sacrificial layer 18 and the upper sacrificial layer 22 are able to be selectively removed from the stacked structure in subsequent processes to form a cavity 29 (shown in FIG. 5) to expose the sidewalls of the bottom electrodes 30. According to an embodiment of the present invention, the lower sacrificial layer 18, the upper sacrificial layer 22 and the hard mask layer 26 are respectively and essentially made of an oxide dielectric material, such as silicon oxide ($SiO_2$) or boron phosphorus doped silica glass (BPSG), but is not limited thereto. The etching stop layer 16, the lower supporting layer 20 and the upper supporting layer 24 are respectively and essentially made of a nitride dielectric material, such as silicon carbon nitride (SiCN) or silicon nitride (SiN), but is not limited thereto. The hard mask layer 26 may be removed when removing the lower sacrificial layer 18 and the upper sacrificial layer 22 if comprising the same material (such as silicon oxide). The height of each of the bottom electrodes may be the same and is determined by the overall thickness of the stack structure. According to an embodiment of the present invention, the height of each of the bottom electrodes is between 1600 and 5000 angstroms, but is not limited thereto. The lower sacrificial layer 18 and the upper sacrificial layer 22 preferably have a thickness more than 5 times of the thicknesses of the lower supporting layer 20 and the upper supporting layer 24 to allow a higher proportion of sidewalls of the bottom electrodes 30 being exposed form the cavity and capacitive coupled with the conductive material 44 (shown in FIG. 6) filling the cavity. The height of each of the top portions of the bottom electrodes 30 protruding from the upper supporting layer 24 is determined by the thickness of the hard mask layer 26. According to an embodiment of the present invention, the hard mask layer 26 preferably has a thickness between 1/3 and 1/10 of the thickness of the upper sacrificial layer 22. The bottom electrodes 30 are arranged corresponding to the storage node contact pads 14 and are electrically connected through the storage node contact pads 14 to the transistor source/drain regions of the memory cells (not shown) in the substrate 10. The bottom electrodes 30 are essentially made of a conductive material. Suitable conductive materials may include metals, such as tungsten (W), copper (Cu), aluminum (Al), titanium (Ti), tantalum (Ta), a compound, alloy or composite layer of the above metal materials, but is not limited thereto. According to an embodiment of the present invention, the bottom electrodes 30 are essentially made of titanium (Ti). In present embodiment, the bottom electrodes 30 are pillar structures. In order to describe the features of the present invention more clearly, the bottom electrodes 30 shown in the cross-sectional view taken along the line AA' are defined as, from the left to the right of FIG. 2, the third bottom electrode 30C, the first bottom electrode 30A, the second bottom electrode 30B, and the fourth bottom electrode 30D. The first bottom electrode 30A is disposed between the second bottom electrode 30B and the third bottom electrode 30C. The fourth bottom electrode 30D and the first bottom electrode 30A are at two sides of the second bottom electrode 30B.

Figure 3:
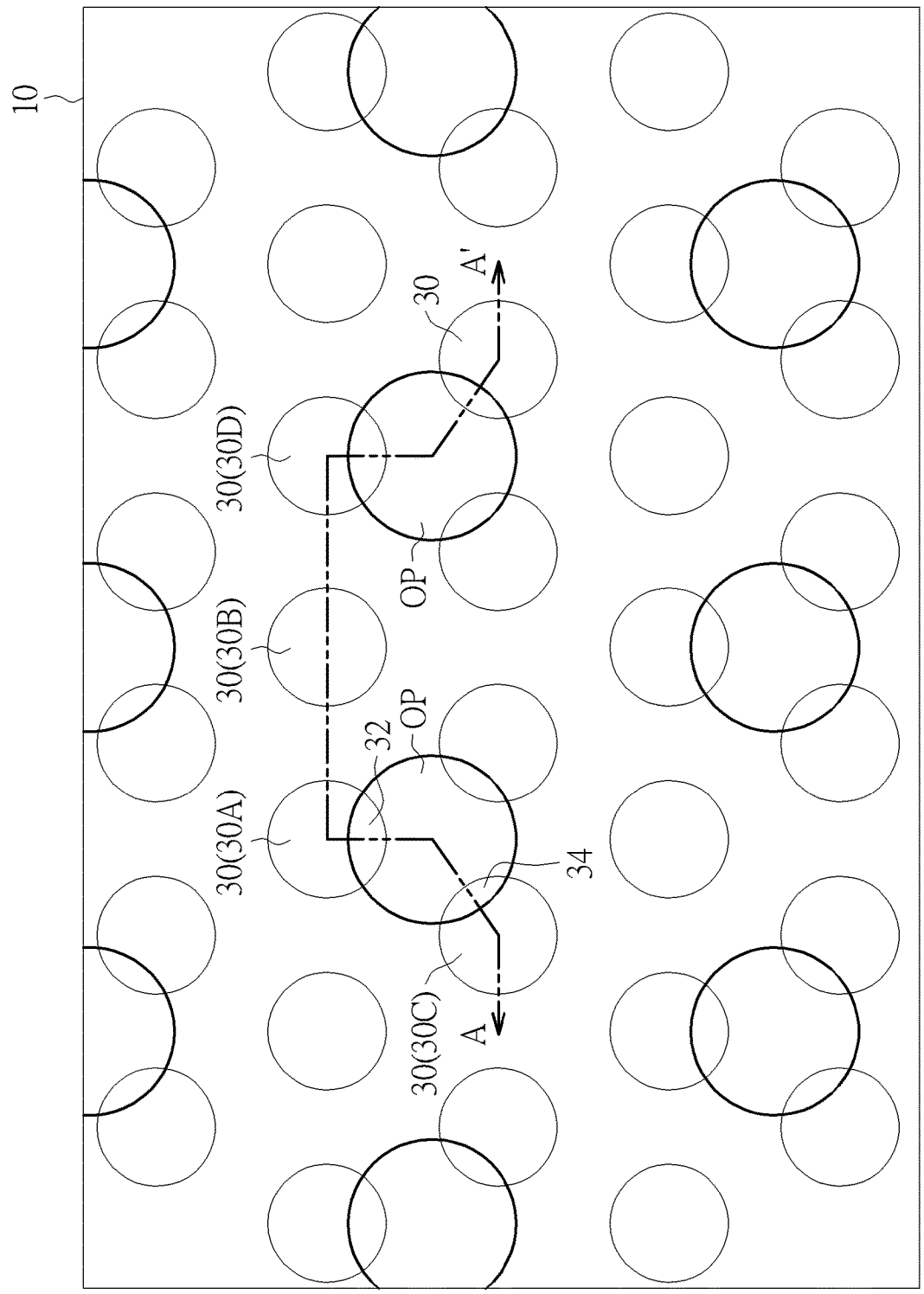
Figure 4:
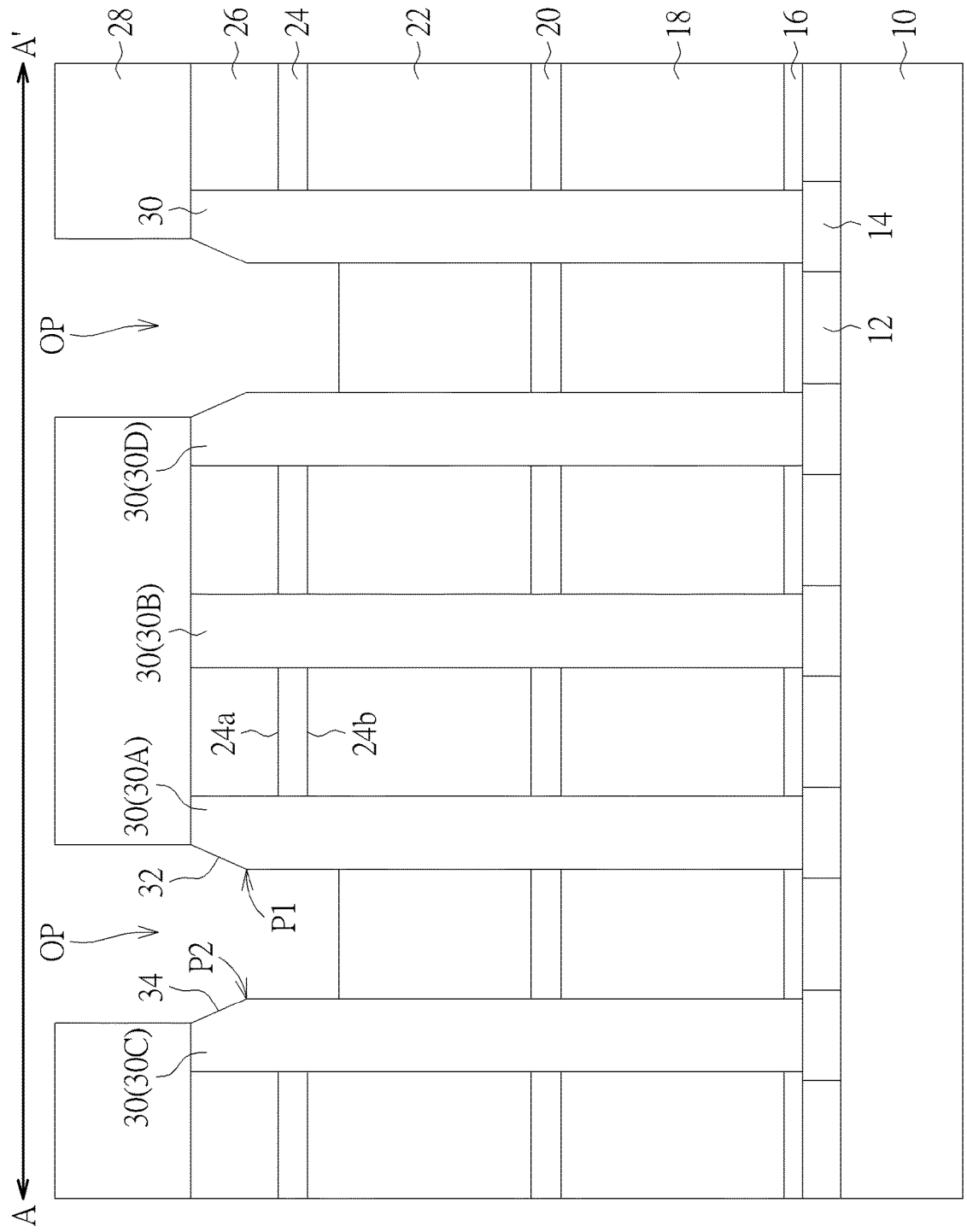

Please refer to FIG. 3 and FIG. 4. Subsequently, a mask layer 28 such as a photoresist layer is formed on the stacked structure. An etching process is performed, using the mask layer 28 as an etching mask to etch the stack structure, thereby forming a plurality of openings OP respectively located between three adjacent bottom electrodes 30 and extending through the hard mask layer 26 and the upper supporting layer 24 to expose a portion of the upper sacrificial layer 22. The openings OP is partially overlapped with the three adjacent bottom electrodes 30 and exposes sidewalls of the three adjacent bottom electrodes 30.

Figure 5:
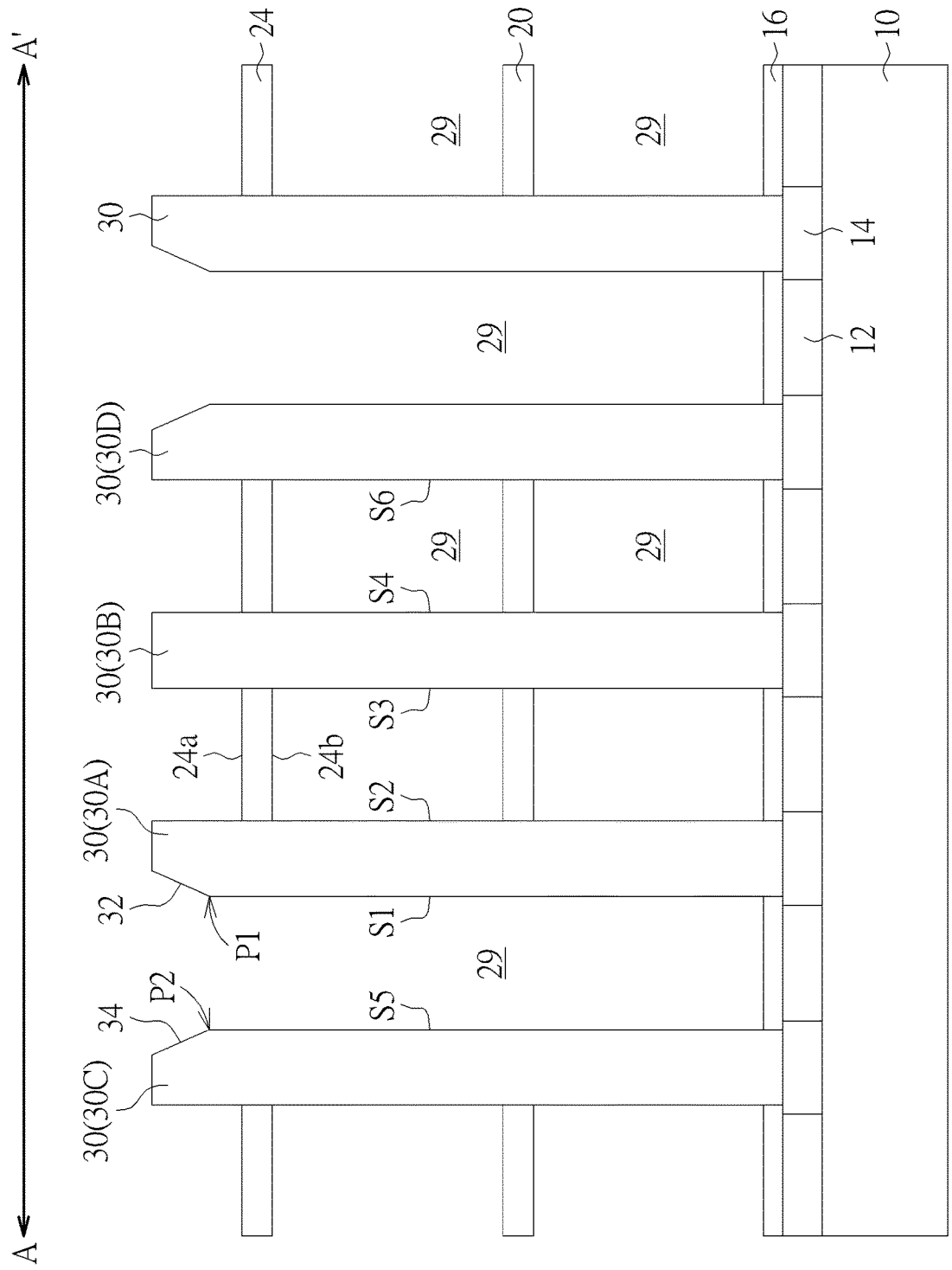

Please refer to FIG. 5. After forming the openings OP and removing the mask layer 28, a selective etching process such as a wet etching process is performed, through the openings OP to remove the upper sacrificial layer 22 and the lower sacrificial layer 18, thereby forming a cavity 29 extending laterally between the upper supporting layer 24, the lower supporting layer 20, and the substrate 10 to expose the sidewalls of the bottom electrodes 30. The lower supporting layer 20 is etched to form openings during the selective etching process so that the lower sacrificial layer 18 may be exposed and removed. According to an embodiment of the present invention, the hard mask layer 26 may be concurrently removed during the selective etching process and exposes the upper surface 24a of the upper supporting layer 24.

Figure 6:
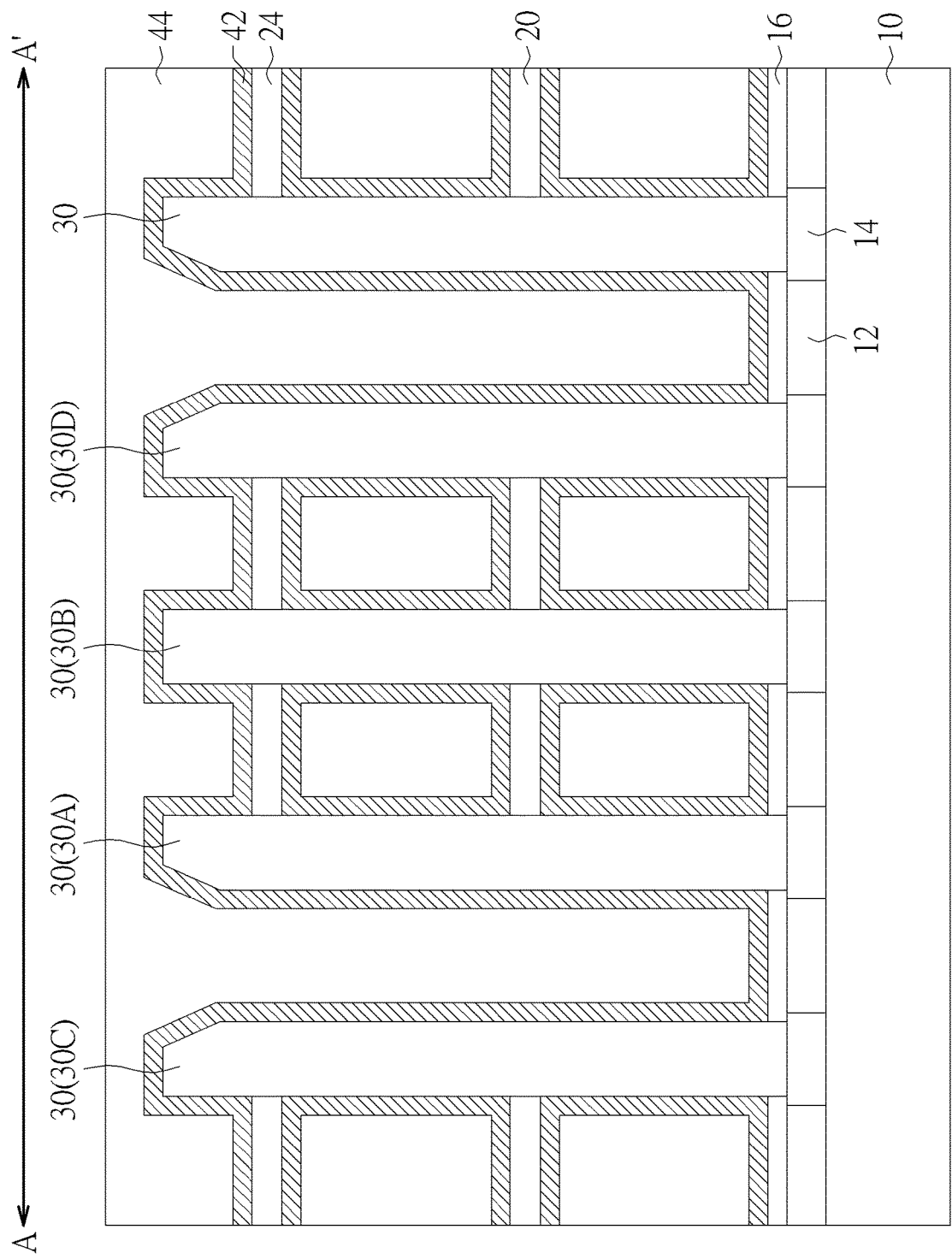

Please refer to FIG. 6. Subsequently, deposition processes are performed to form a capacitor dielectric layer 42 along sidewalls of the bottom electrodes 30 and surfaces of the upper supporting layer 24, the lower supporting layer 20 and the etching stop layer 16, and a conductive material 44 on the capacitor dielectric layer 42 and completely filling the cavity 29 and covering the bottom electrodes 30, so that the semiconductor structure of the present may be obtained. The capacitor dielectric layer 42 is essentially made of a dielectric material such as silicon oxide ($SiO_2$), silicon nitride (SiN), a high-k dielectric material, or a combination thereof, but is not limited thereto. The conductive material 44 may include a metal, such as tungsten (W), copper (Cu), aluminum (Al), titanium (Ti), tantalum (Ta), a compound, alloy or composite layer of the above metal materials, but is not limited thereto. According to an embodiment of the present invention, the conductive material 44 is essentially made of titanium (Ti). The conductive material 44 and the bottom electrodes 30 are completely separated by the capacitor dielectric layer 42 and not in contact with each other. The conductive material 44 is used as a top electrode that is capacitively coupled to the bottom electrodes 30 to form capacitors.

One feature of the present invention is that, the top corner each of the bottom electrodes 30 exposed from the openings OP are etched to produce a slope profile when forming the openings OP, such as the slope profile 32 on the top portion of the first bottom electrode 30A and the slope profile 34 on the top portion of the third bottom electrode 30C as shown in FIG. 3, FIG. 4, FIG. 5. The capacitor dielectric layer 42 and the conductive material 44 are less likely to accumulate on the slope profiles during deposition, which otherwise may obstruct the precursor gases of the capacitor dielectric layer 42 and the conductive material 44 diffusing into the cavity 29 and result in poor film quality. Accordingly, the present invention may produce the capacitor dielectric layer 42 and the conductive material 44 with improved film quality and uniformity, and reliability of the capacitors may be improved.

Furthermore, the slope and height of the slope profiles may be adjusted by adjusting process parameters when etching the openings OP. In preferred embodiments, the lower ends of the slope profiles (such as the lower end P1 of the slope profile 32 and the lower end P2 of the slope profile 34) are not lower than the lower surface 24b of the upper supporting layer 24. In this way, the bottom electrodes 30 with the slope profiles (such as the first bottom electrode 30A, the third bottom electrode 30C, and the fourth bottom electrode 30D) and the bottom electrodes 30 without the slope profiles (such as the second bottom electrode 30B) may have substantially identical straight sidewall profiles under the lower surface 24b, so that the electrical characters of the capacitors may be more consistent.

Overall, as shown in FIG. 5, the semiconductor structure provided by the present invention includes a substrate 10, a first bottom electrode 30A and a second bottom electrode 30B disposed adjacent to each other on the substrate 10. The first bottom electrode 30A includes a first sidewall S1 and a second sidewall S2. The second bottom electrode 30B includes a third sidewall S3 at the side opposite to the second sidewall S2 and a fourth sidewall S4 on the other side. The upper supporting layer 24 extends laterally between the first bottom electrode 30A and the second bottom electrode 30B and is in direct contact with the second sidewall S2 and the third sidewall S3. A top portion of the first sidewall Si includes a slope profile 32 having a lower end P1 higher than an upper surface 24a of the upper supporting layer 24. The top portions of the second sidewall S2 and the third sidewall S3 respectively have a straight profile perpendicular to the upper surface 24a of the upper supporting layer 24. A third bottom electrode 30C is disposed on the substrate 10 and adjacent to the first bottom electrode 30A, and has a fifth sidewall S5 opposite to the first sidewall S1. The upper supporting layer 24 is not extending between the fifth sidewall S5 and the first sidewall S1. The top portion of the fifth sidewall S5 includes another slope profile 34 having a lower end P2 higher than the upper surface 24a of the upper supporting layer 24 and substantially flush with the lower end point P1 of the slope profile 32. A fourth bottom electrode 30D is disposed on the substrate 10 and adjacent to the second bottom electrode 30B, and has a sixth sidewall S6 opposite to the fourth sidewall S4. The upper supporting layer 24 further extends laterally between the fourth bottom electrode 30D and the second bottom electrode 30B and is in direct contact with the sixth sidewall S6 and the fourth sidewall S4. The top portion of the sixth sidewall S6 includes a straight profile perpendicular to the upper surface 24a of the upper supporting layer 24. The first bottom electrode 30A, the second bottom electrode 30B, the third bottom electrode 30C, and the fourth bottom electrode 30D are pillar structures, respectively. A cavity 29 extends laterally between the upper supporting layer 24 and the substrate 10 to expose the sidewalls of the bottom electrodes. In some embodiments, the semiconductor structure further includes a lower supporting layer 20 extending laterally between the upper supporting layer 24 and the substrate 10 and directly contacting the second sidewall S2, the third sidewall S3, the fourth sidewall S4 and the sixth sidewall S6. The lower supporting layer 20 is not extending between the fifth sidewall S5 and the first sidewall S1. As shown in FIG. 6, the semiconductor structure may further include a capacitor dielectric layer 42 covering along the top surfaces and sidewalls of the bottom electrodes 30 and surfaces of the upper supporting layer 24, the lower supporting layer 20 and the etching stop layer 16. A conductive material 44 is formed on the capacitor dielectric layer 42 and completely covers the bottom electrodes 30 and fills the cavity 29.

Figure 7:
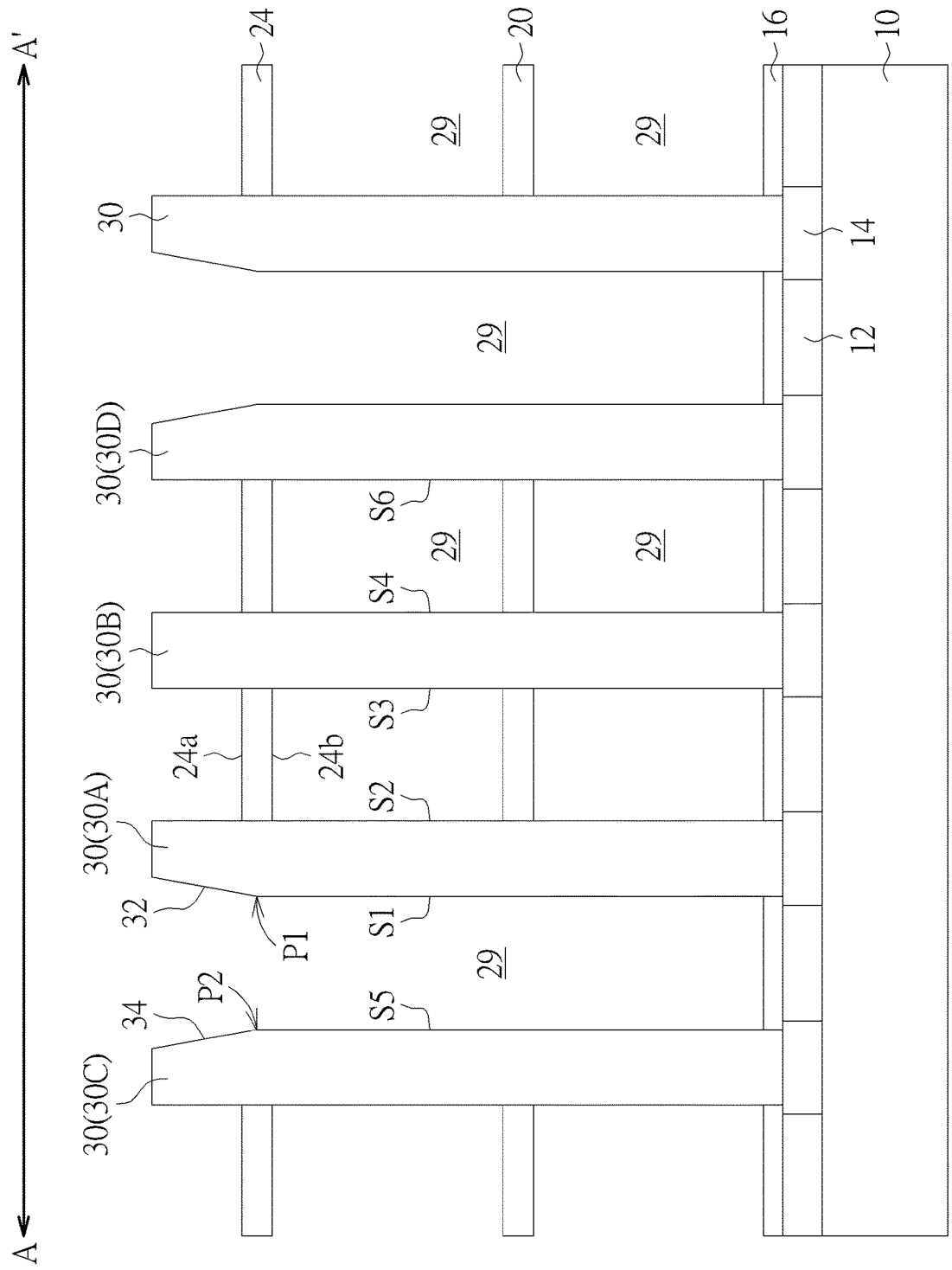
FIG. 7 is a schematic cross-sectional view of a semiconductor structure according to another embodiment of the present invention.

FIG. 7 is a schematic cross-sectional view of a semiconductor structure according to another embodiment of the present invention. The same reference signs are used to designate similar or same features in FIG. 7 and FIG. 5. As previously illustrated, the slope and height of the slope profiles may be adjusted by adjusting process parameters when etching the openings OP. In the embodiment shown in FIG. 7, the lower end P1 of the slope profile 32 and the lower end P2 of the slope profile 34 may be controlled to be between the upper surface 24a and lower surface 24b of the upper supporting layer 24.

Figure 8:
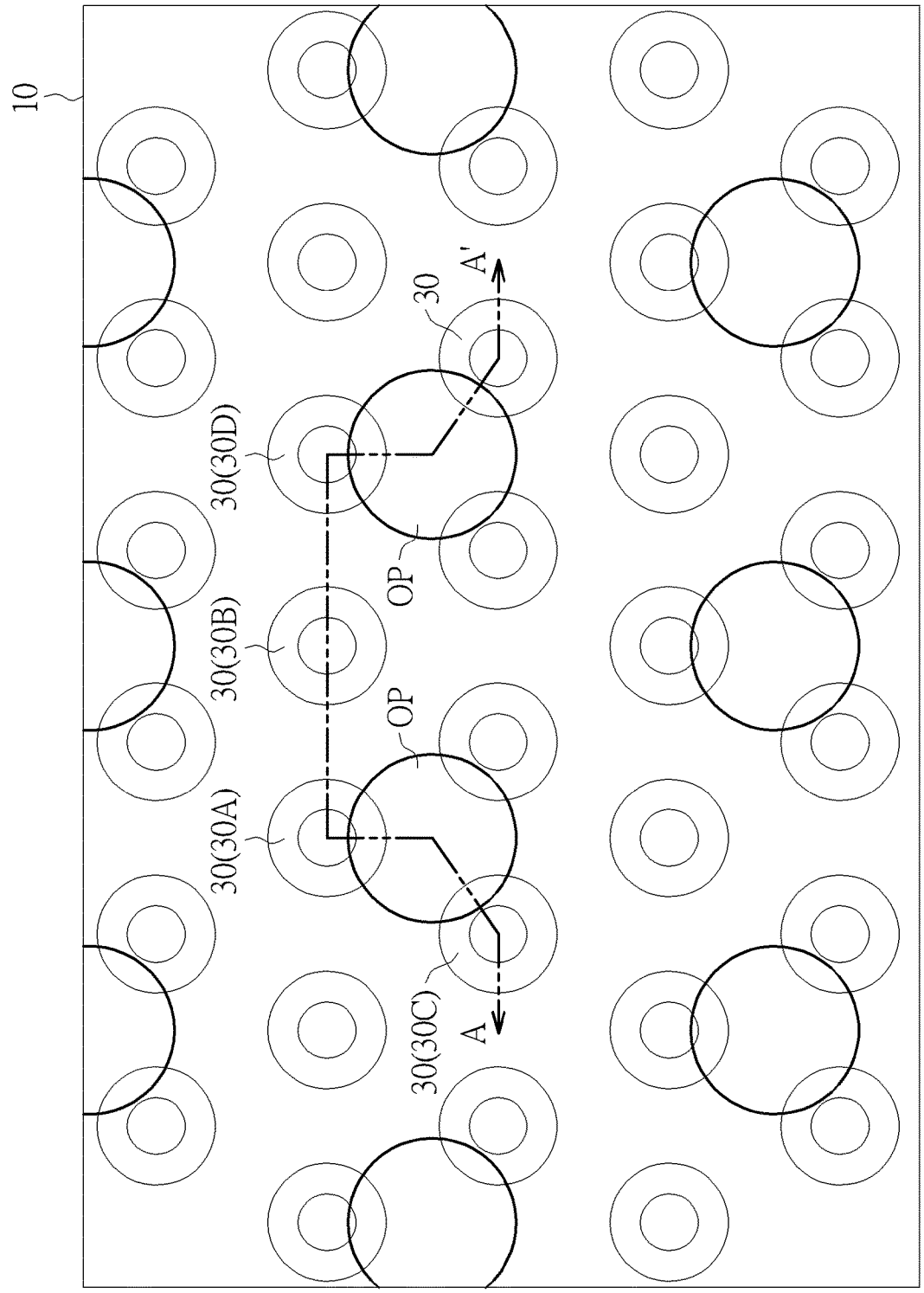
Figure 9:
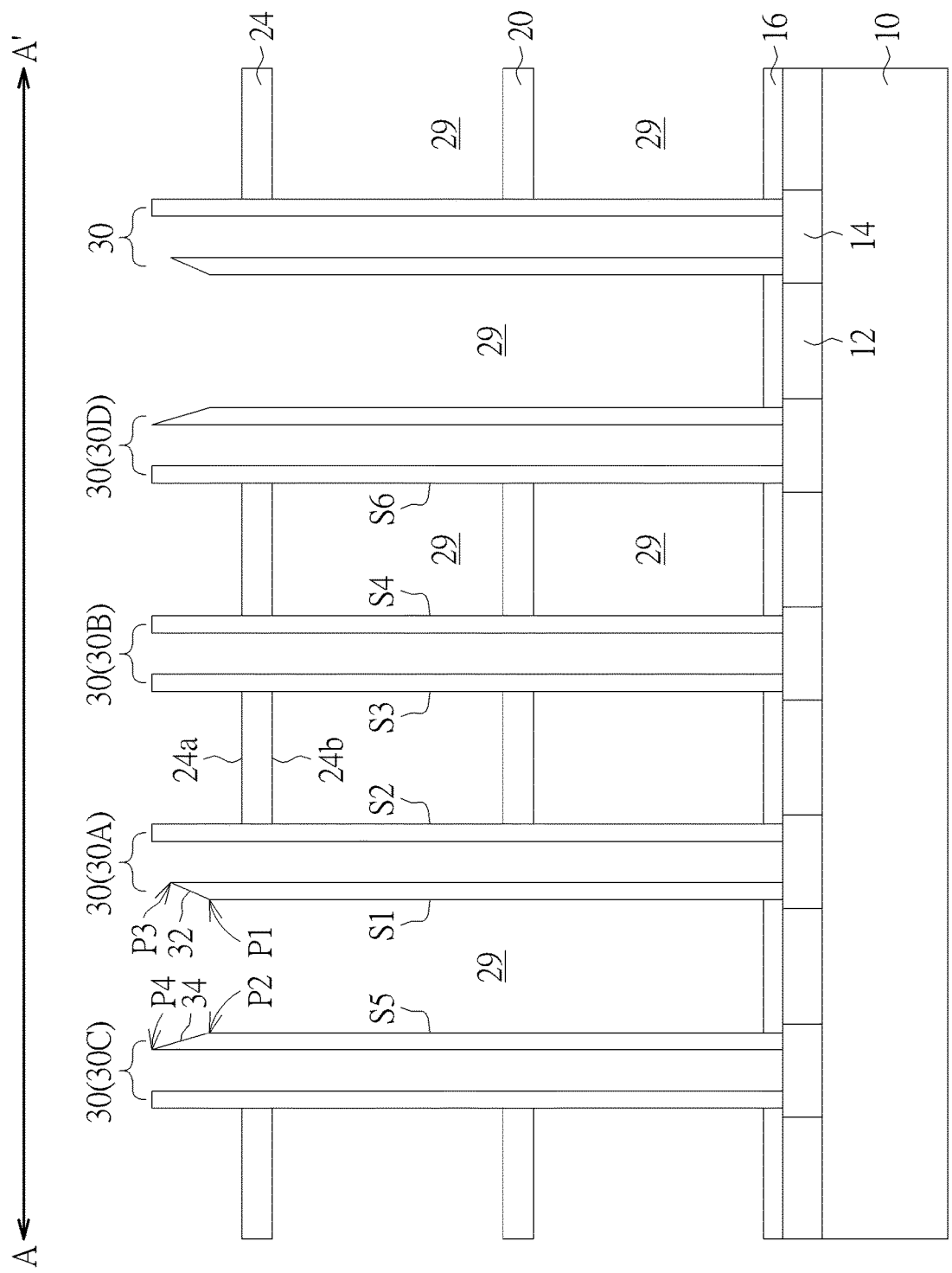
Figure 10:
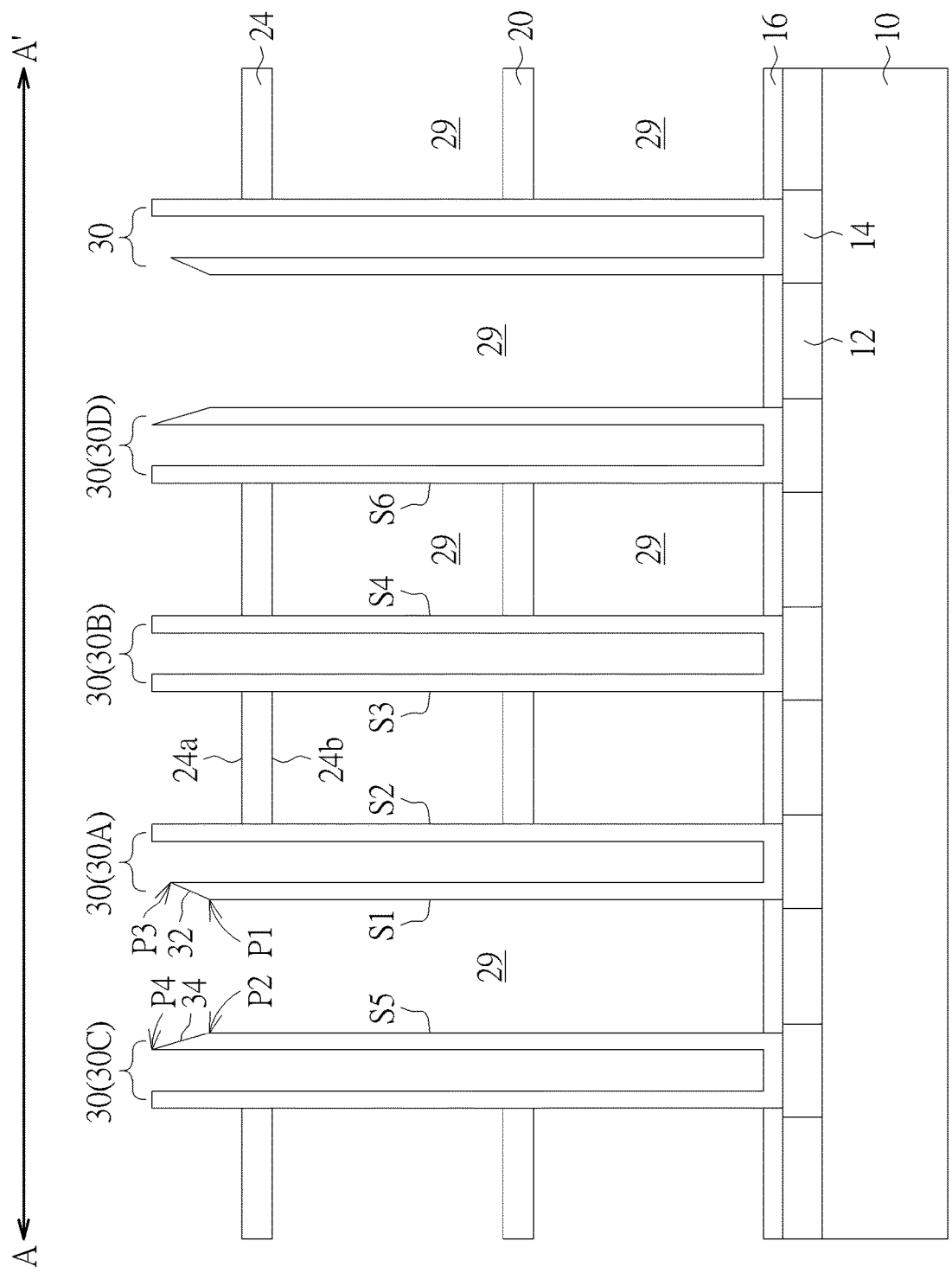
FIG. 10 is a cross-sectional view of a variant of the semiconductor structure shown in FIG. 8 along the line AA'.

FIG. 8 and FIG. 9 are schematic drawings illustrating a semiconductor structure according to still another embodiment of the present invention, wherein FIG. 8 is a plan view, and FIG. 9 is a cross-sectional view taken along the line AA' shown in FIG. 8. FIG. 10 is a cross-sectional view of a variant of the semiconductor structure shown in FIG. 8 along the line AA'. The same reference signs are used to designate similar or same features in FIG. 8, FIG. 9, FIG. 10 and FIG. 3 and FIG. 5. In this embodiment, the bottom electrodes 30 may be hollow cylindrical structures with open or closed bottom ends, respectively. The conductive material 44 also fills the hollow portions of the bottom electrodes 30, such that the capacitive coupling area between the conductive material 44 and each of the bottom electrodes 30 may increase to fulfill the needs for larger capacitances. In the plan view as shown in FIG. 8, the bottom electrodes 30 may respectively have a closed ring shape. In the cross-sectional view as shown in FIG. 9, each of the bottom electrodes 30 may have an opened bottom end that exposes the top surface of one of the storage node contact pads 14. In the cross-section view as shown in FIG. 10, each of the electrodes 30 may respectively have a U-shaped closed bottom end. Each of the openings OP is disposed between three adjacent hollow-cylindrical-type bottom electrodes 30 and partially overlaps the bottom electrodes 30. In some embodiments, at least one of the three adjacent bottom electrodes 30 may have the hollow portion thereof being overlapped with the opening OP and has a slope profile with an upper end lower than the upper end of a straight profile of the bottom electrode 30. For example, the first bottom electrode 30A may have the hollow portion partially overlapped with an opening OP, and the upper end P3 of the slope profile 32 (also the upper end of the first spacer S1) is lower than the upper end of the second sidewall S2. In some embodiments, at least one of the openings OP may be offset from the middle of the three adjacent bottom electrodes 30, and the upper ends of the slope profiles of the three adjacent bottom electrodes 30 may be at different heights. For example, the opening OP between the first bottom electrode 30A and the third bottom electrode 30C may be closer to the first bottom electrode 30A, and the upper end P3 of the slope profile 32 is at a height lower than the upper end P4 of the slope profile 34 (also the upper end of the fifth sidewall S5).

In summary, the present invention provides a semiconductor structure and method for forming the same, in which the top portions of the bottom electrodes adjacent to the openings respectively have a slope profile to facilitate the capacitor dielectric layer and the conductive material being formed in the cavity with an improved film quality. In this way, the reliability of the capacitors may be improved. Furthermore, by controlling the lower end of the slope profiles not lower than the lower surface of the upper supporting layer, the differences between bottom electrodes with slope profiles (the bottom electrodes adjacent to the openings) and bottom electrodes without slope profiles (the bottom electrodes not adjacent to the openings) may be reduced, so that electrical characters of the capacitors may be more consistent. It should be noted that the semiconductor structure including two supporting layers is only an example. In other embodiments, the number of layers of the stacked structure may be adjusted according to design needs. For example, the stacked structure may include three supporting layers (the upper, middle, lower supporting layers) to provide a stronger structure support. In another example, the stacked structure may use only one supporting layer (the upper supporting layer or the middle supporting layer) to simplify the manufacturing process. These examples are also included in the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate;
   a first bottom electrode and a second bottom electrode disposed on the substrate, wherein the first bottom electrode comprises a first sidewall and a second sidewall, the second bottom electrode comprises a third sidewall and a fourth sidewall, the second sidewall is opposite to the third sidewall, an upper portion of the first sidewall comprises a slope profile;
   an upper supporting layer extending laterally between the first bottom electrode and the second bottom electrode and directly contacting the second sidewall and the third sidewall, wherein the upper supporting layer comprises an upper surface and a lower surface, and a lower end of the slope profile of the first sidewall is not lower than the lower surface of the upper supporting layer;
   a cavity extending laterally between the substrate and the upper supporting layer;
   a capacitor dielectric layer covering along the first bottom electrode and the second bottom electrode; and
   a conductive material disposed on the capacitor dielectric layer and filling the cavity.

2. The semiconductor structure according to claim 1, wherein the lower end of the slope profile is between the upper surface and the lower surface of the upper supporting layer.

3. The semiconductor structure according to claim 1, wherein the lower end of the slope profile is higher than the upper surface of the upper supporting layer.

4. The semiconductor structure according to claim 1, wherein upper portions of the second sidewall and the third sidewall respectively comprise a straight profile perpendicular to the upper surface of the upper supporting layer.

5. The semiconductor structure according to claim 1, further comprising:
   a third bottom electrode disposed on the substrate and comprising a fifth sidewall being opposite to the first sidewall of the first bottom electrode, wherein the upper supporting layer is not extending between the fifth sidewall and the first sidewall, and an upper portion of the fifth sidewall comprises another slope profile having a lower end flush with the lower end of the slope profile.

6. The semiconductor structure according to claim 5, wherein upper ends of the slope profile and the another slope profile are not at a same height.

7. The semiconductor structure according to claim 1, further comprising:
   a fourth bottom electrode disposed on the substrate and comprising a sixth sidewall being opposite to the fourth sidewall of the second bottom electrode, wherein the upper supporting layer further extends laterally between the second bottom electrode and the fourth bottom electrode and directly contacting the fourth sidewall and the sixth sidewall, wherein an upper portion of the sixth sidewall comprises another straight profile perpendicular to the upper surface of the upper supporting layer.

8. The semiconductor structure according to claim 1, wherein the first bottom electrode and the second bottom electrode are pillar structures, respectively.

9. The semiconductor structure according to claim 1, wherein the first bottom electrode and the second bottom electrode respectively are hollow cylindrical structures, respectively.

10. The semiconductor structure according to claim 1, further comprising a lower supporting layer extending laterally between the upper supporting layer and the substrate and directly contacting the second sidewall and the third sidewall.

11. A method for forming a semiconductor structure, comprising:
    providing a substrate;
    successively forming an upper sacrificial layer, an upper supporting layer and a hard mask layer on the substrate;
    forming a plurality of bottom electrodes penetrating through the upper sacrificial layer, the upper supporting layer and the hard mask layer;

forming at least an opening between the bottom electrodes and penetrating through the hard mask layer and the upper supporting layer to expose a portion of the upper sacrificial layer, wherein a portion of at least one of the bottom electrodes exposed from the opening has a slope profile having lower end not lower than a lower surface of the upper supporting layer;

removing the upper sacrificial layer from the opening to form a cavity between the upper sacrificial layer and the substrate; and forming a capacitor dielectric layer along the bottom electrodes and a conductive material on the capacitor dielectric layer and filling the cavity.

12. The method for forming a semiconductor structure according to claim 11, wherein top surfaces of the bottom electrodes are flush with an upper surface of the hard mask layer.

13. The method for forming a semiconductor structure according to claim 11, wherein the hard mask is removed during removing the upper sacrificial layer.

14. The method for forming a semiconductor structure according to claim 13, wherein the lower end of the slope profile is between an upper surface and the lower surface of the upper supporting layer.

15. The method for forming a semiconductor structure according to claim 13, wherein the lower end of the slope profile is higher than an upper surface of the upper supporting layer.

16. The method for forming a semiconductor structure according to claim 11, wherein the bottom electrodes and the conductive material are separated by the capacitor dielectric layer and not contact each other.

17. The method for forming a semiconductor structure according to claim 11, wherein the bottom electrodes are pillar structures, respectively.

18. The method for forming a semiconductor structure according to claim 11, wherein the bottom electrodes are hollow cylindrical structures, respectively.

19. The method for forming a semiconductor structure according to claim 11, further comprising:

forming a lower sacrificial layer on the substrate;

forming a lower supporting layer on the lower sacrificial layer; and forming the upper sacrificial layer, the upper supporting layer and the hard mask layer on the lower supporting layer.

20. The method for forming a semiconductor structure according to claim 19, further comprising:

removing the lower sacrificial layer to form another cavity between the lower supporting layer and the substrate; and forming the capacitor dielectric layer and the conductive material to fill the another cavity.

* * * * *